US 9,346,966 B2

(12) United States Patent
Schulz et al.

(10) Patent No.: US 9,346,966 B2
(45) Date of Patent: May 24, 2016

(54) LIQUID SILANE-BASED COMPOSITIONS AND METHODS FOR PRODUCING SILICON-BASED MATERIALS

(71) Applicant: NDSU RESEARCH FOUNDATION, Fargo, ND (US)

(72) Inventors: Douglas L. Schulz, Fargo, ND (US); Justin Hoey, Fargo, ND (US); Xiangfa Wu, Fargo, ND (US); Iskander Akhatov, West Fargo, ND (US); Philip Boudjouk, Fargo, ND (US); Xuliang Dai, Solon, OH (US); Larry Pederson, West Fargo, ND (US); Jeremiah Smith, Fargo, ND (US); Arumugasamy Elangovan, Fargo, ND (US); Sijin Han, Milpitas, CA (US)

(73) Assignee: NDSU RESEARCH FOUNDATION, Fargo, ND (US)

( * ) Notice: Subject to any disclaimer, the term of this patent is extended or adjusted under 35 U.S.C. 154(b) by 693 days.

(21) Appl. No.: 13/645,551

(22) Filed: Oct. 5, 2012

(65) Prior Publication Data
US 2013/0093122 A1 Apr. 18, 2013

Related U.S. Application Data

(63) Continuation of application No. PCT/US2011/031478, filed on Apr. 6, 2011.

(60) Provisional application No. 61/321,338, filed on Apr. 6, 2010.

(51) Int. Cl.
*C09D 11/00* (2014.01)
*C01B 33/021* (2006.01)
(Continued)

(52) U.S. Cl.
CPC ............ *C09D 11/00* (2013.01); *B29D 99/0078* (2013.01); *C01B 33/021* (2013.01);
(Continued)

(58) Field of Classification Search
USPC ........................................................ 264/465
See application file for complete search history.

(56) References Cited

U.S. PATENT DOCUMENTS

| 7,794,833 B2 | 9/2010 | Balkus, Jr. et al. |
| 2006/0159899 A1 | 7/2006 | Edwards et al. |

(Continued)

FOREIGN PATENT DOCUMENTS

| EP | 1134224 A2 | 9/2001 |
| KR | 10-2007-0108408 A | 11/2007 |

(Continued)

OTHER PUBLICATIONS

Korean Intellectual Property Office, International Search Report and Written Opinion issued on Jul. 25, 2013 for corresponding International Patent Application No. PCT/US2012/000497 (pp. 1-13) with claims searched (pp. 14-17) pp. 1-17.

(Continued)

*Primary Examiner* — Jacob Thomas Minskey
(74) *Attorney, Agent, or Firm* — O'Banion & Ritchey LLP; John P. O'Banion

(57) ABSTRACT

Described herein are synthesis schemes and methods for producing silicon based nanostructures and materials, including compositions and methods for synthesis of silicon-based nanowires and composites from three-component and four-component liquid silane/polymer inks. Materials and methods for producing silicon based micro and nanofibers that can be used in a variety of applications including material composites, electronic devices, sensors, photodetectors, batteries, ultracapacitors, and photosensitive substrates, and the like.

24 Claims, 5 Drawing Sheets

(51) Int. Cl.

| | | |
|---|---|---|
| *D04H 1/4209* | (2012.01) | |
| *D04H 1/4382* | (2012.01) | |
| *D04H 1/728* | (2012.01) | |
| *D06M 11/74* | (2006.01) | |
| *H01M 4/134* | (2010.01) | |
| *H01M 4/36* | (2006.01) | |
| *H01M 4/38* | (2006.01) | |
| *H01M 4/62* | (2006.01) | |
| *B29D 99/00* | (2010.01) | |
| *D01D 5/34* | (2006.01) | |
| *D01F 9/14* | (2006.01) | |
| *D01D 5/00* | (2006.01) | |
| *D01F 1/10* | (2006.01) | |
| *B82Y 40/00* | (2011.01) | |
| *H01L 21/02* | (2006.01) | |

(52) U.S. Cl.
CPC ............... *D01D5/0038* (2013.01); *D01D 5/34* (2013.01); *D01F 1/10* (2013.01); *D01F 9/14* (2013.01); *D04H 1/4209* (2013.01); *D04H 1/4382* (2013.01); *D04H 1/728* (2013.01); *D06M 11/74* (2013.01); *H01M 4/134* (2013.01); *H01M 4/366* (2013.01); *H01M 4/38* (2013.01); *H01M 4/625* (2013.01); *B82Y 40/00* (2013.01); *H01L 21/02532* (2013.01); *H01L 21/02603* (2013.01); *H01L 21/02628* (2013.01); *Y02E 60/122* (2013.01); *Y02P 70/54* (2015.11); *Y10S 977/895* (2013.01)

(56) References Cited

U.S. PATENT DOCUMENTS

| | | | |
|---|---|---|---|
| 2008/0145655 A1 | 6/2008 | Hellring et al. | |
| 2008/0150556 A1* | 6/2008 | Han et al. | 324/693 |
| 2008/0199687 A1 | 8/2008 | Chiruvolu et al. | |
| 2009/0130301 A1* | 5/2009 | Bahnmuller et al. | 427/122 |
| 2009/0136932 A1* | 5/2009 | Craighead et al. | 435/6 |
| 2009/0169725 A1 | 7/2009 | Zhamu | |
| 2009/0269511 A1 | 10/2009 | Zhamu | |
| 2011/0187798 A1* | 8/2011 | Rogers et al. | 347/55 |

FOREIGN PATENT DOCUMENTS

| | | |
|---|---|---|
| WO | 91/16479 A1 | 10/1991 |
| WO | 2009/011709 A1 | 1/2009 |
| WO | 2011-127218 A2 | 10/2011 |

OTHER PUBLICATIONS

Schulz, D.L., et al., "Electrospun a-Si using Liquid SilanelPolymer Inks," Department of Energy (DOE) Information Bridge: DOE Scientific and Technical Information webpublication, last updated Jul. 23, 2012, Accessed Jan. 21, 2013, http://www.osti.gov/bridge/purl.coverjsp?purl=/1004087/, pp. 1-4.

Xiao, J. et al., "Stabilization of Silicaon Anode for Li-Ion Batteries," Journal of the Electrochemical Society, Aug. 2, 2010, vol. 157 (10), pp. A1047-A1050.

Korean Intellectual Property Office, International Search Report and Written Opinion Issued on Dec. 15, 2011 for corresponding International Patent Application No. PCT US2011/031478 (pp. 1-8), with claims examined (pp. 9-13) pp. 1-13.

Ji, L. and Zhang, X., "Electrospun carbon nanofibers containing silicon particles as an energy-storage medium," Carbon, Jul. 19, 2009, vol. 47, pp. 3119-3226.

Wang et al., "Silica Nanotubes and Nanofiber Arrays," Advanced Materials, Dec. 15, 2000, vol. 12, No. 24, pp. 1938-1940.

European Patent Office (EPO), Extended Supplementary Search Report (ESSR) issued on Dec. 18, 2013 for corresponding European Patent Application No. 11766686.7 (PCT/US2011031478))(pp. 1-7) with claims searched (pp. 8-11) pp. 1-11.

Ji L et al: "Fabrication of porous carbon/Si composite nanofibers as high-capacity battery electrodes", Electrochemistry Communications, Elsevier, Amsterdam, NL, vol. II, No. 6, Jun. 1, 2009, pp. 1146-1149.

Zhou Ming et al: "Growth and characterization of aligned ultralong and diameter-controlled silicon nanotubes by hot wire chemical vapor deposition using electrospun poly(vinyl pyrrolidone) nanofiber template", Journal of Applied Physics, American Institute of Physics. New York, US, vol. 106, No. 12, Dec. 29, 2009, pp. 124315-124315.

Ohigashi R et al: "Electric Ejection of Viscous Inks From MEMS Capillary Array Head for Direct Drawing of Fine Patterns", Journal of Microelectromechanical Systems, IEEE Service Center, US, vol. 17, No. 2, Apr. 1, 2008, pp. 272-277.

\* cited by examiner

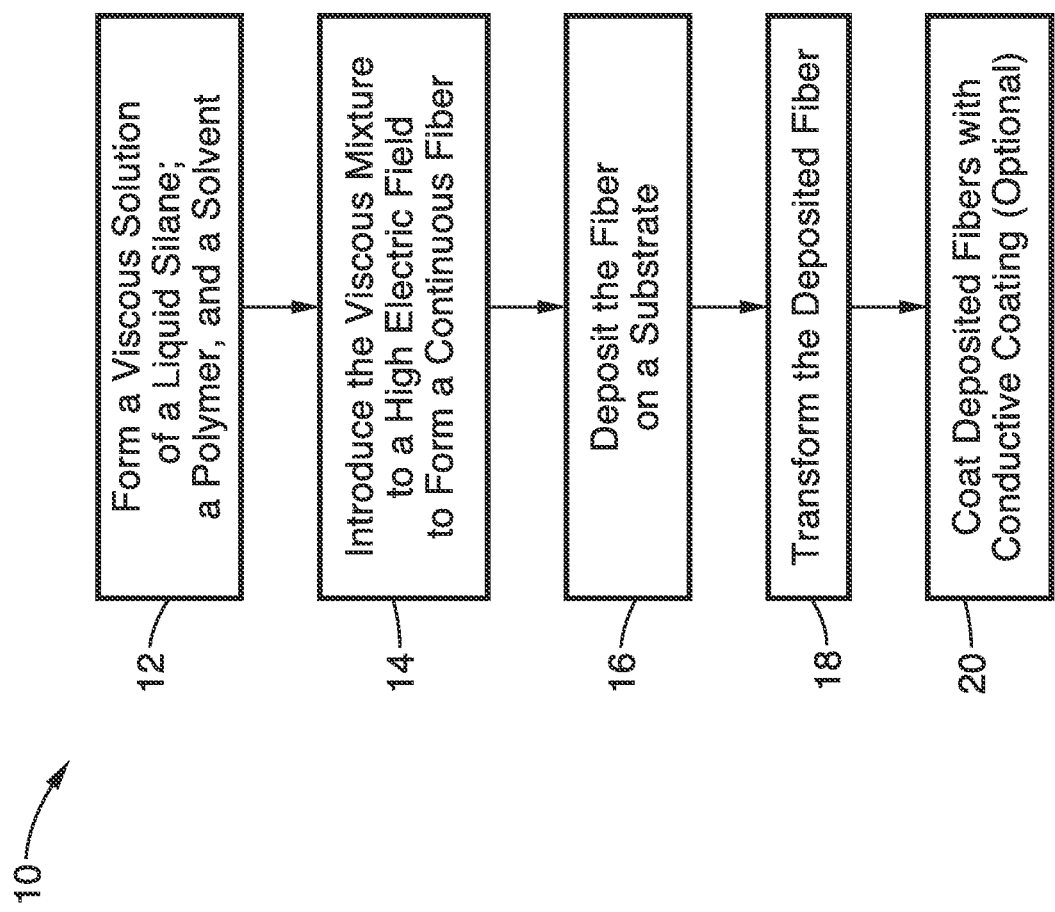

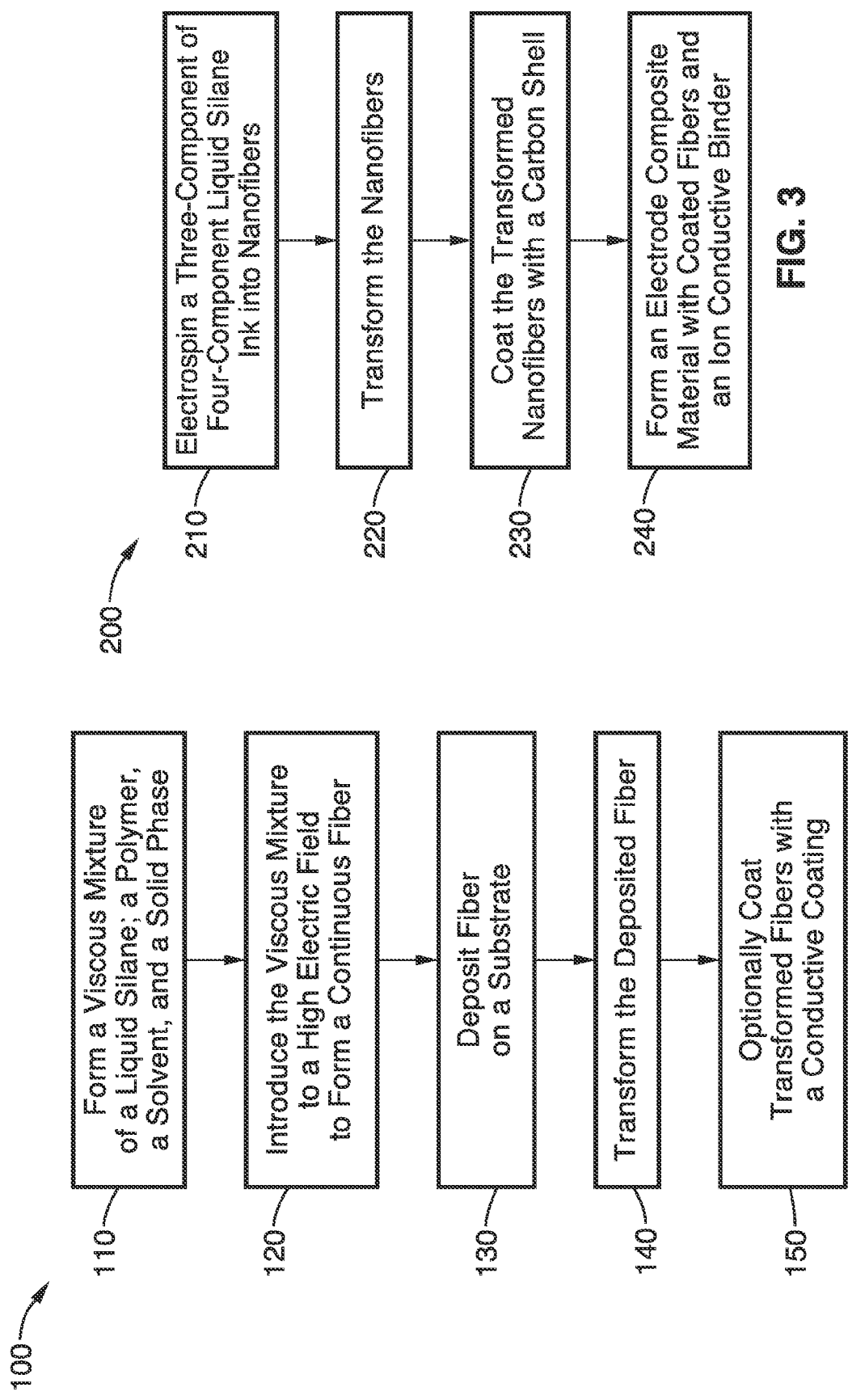

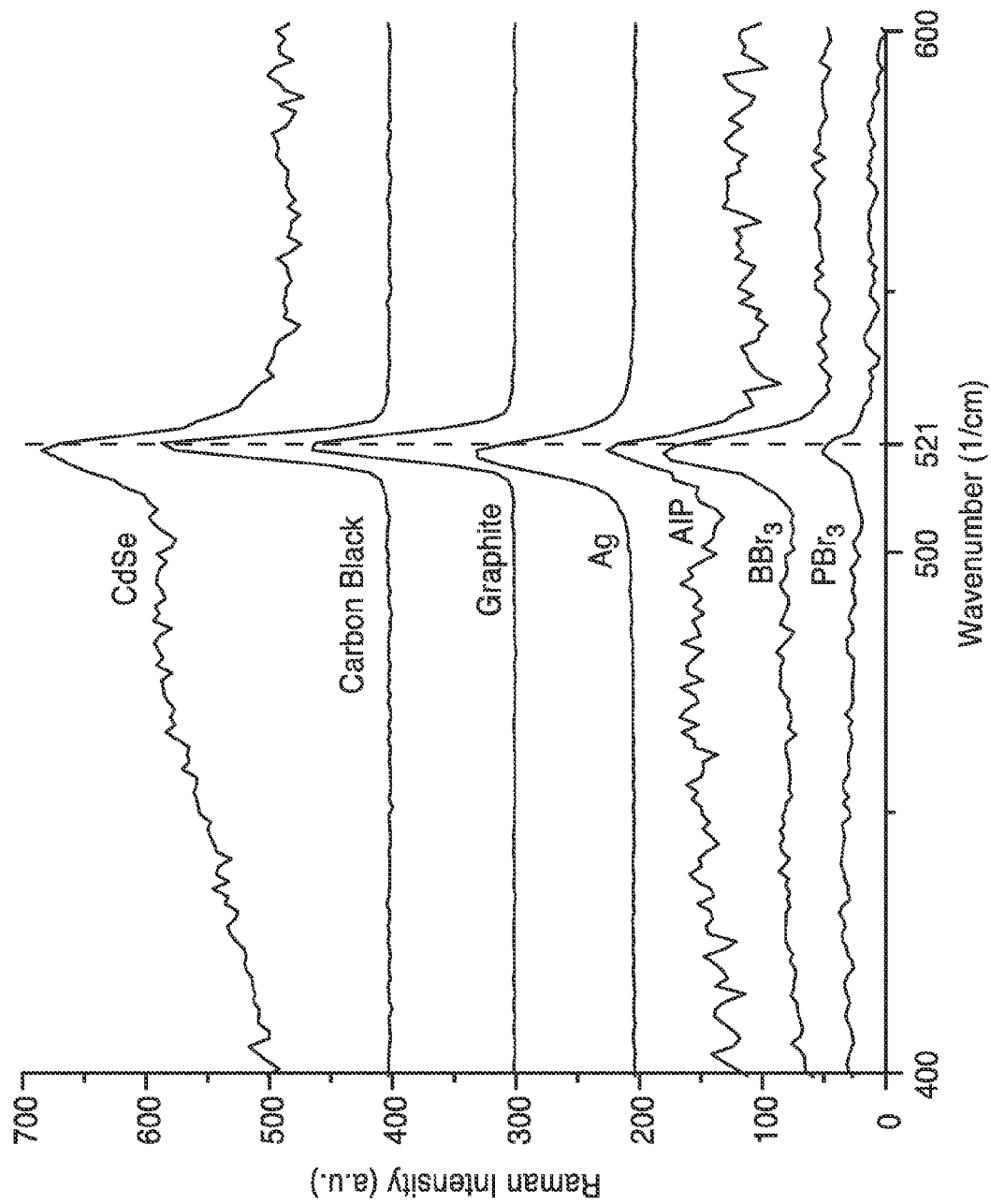

US 9,346,966 B2

LIQUID SILANE-BASED COMPOSITIONS AND METHODS FOR PRODUCING SILICON-BASED MATERIALS

CROSS-REFERENCE TO RELATED APPLICATIONS

This application a 35 U.S.C. §111(a) continuation of PCT international application number PCT/US2011/031478 filed on Apr. 6, 2011, incorporated herein by reference in its entirety, which is a nonprovisional of U.S. provisional patent application serial number 61/321,338 filed on Apr. 6, 2010, incorporated herein by reference in its entirety. Priority is claimed to each of the foregoing applications.

The above-referenced PCT international application was published as PCT International Publication No. WO 2011/127218 on Oct. 13, 2011 and republished on Feb. 2, 2012, and is incorporated herein by reference in its entirety.

STATEMENT REGARDING FEDERALLY SPONSORED RESEARCH OR DEVELOPMENT

This invention was made with Government support under Grant Number EPS-0447679 awarded by North Dakota EPS-CoR/National Science Foundation and under agreement Number H94003-09-2-0905 awarded by the DoD Defense Microelectronics Activity (DMEA). The Government has certain rights in the invention.

INCORPORATION-BY-REFERENCE OF MATERIAL SUBMITTED ON A COMPACT DISC

Not Applicable

BACKGROUND OF THE INVENTION

1. Field of the Invention

This invention pertains generally to synthesis schemes and methods for producing silicon based nanostructures and materials, and more particularly to compositions and methods for synthesis of silicon-based nanowires and composites from three-component and four-component liquid silane/polymer inks.

2. Description of Related Art

Future generation electronics will feature components that are manufactured by continuous processing. Two-dimensional webs that serve as the substrate in roll-to-roll manufacturing are subjected to additive processes where various materials are deposited and then transformed to give functioning circuit components. The beneficial electrical and electrochemical properties of silicon have been demonstrated in integrated circuits, solar cells and battery electrodes. Such materials are typically produced by chemical vapor deposition or by etching a Si wafer and these processes are not amendable to continuous manufacturing.

For example, there is increasing interest in replacing carbon-based materials with silicon or silicon-based compounds as anodes in next-generation lithium ion batteries (LIBs). Silicon has a theoretical capacity of approximately 4200 mAh/g, which is more than ten times greater than the 372 mAh/g capacity of conventional graphite anode materials. Therefore, Si-based anodes could increase the energy density of lithium ion batteries significantly.

However, fully lithiated silicon ($Li_{22}Si_5$) undergoes a >300% volume expansion during the lithiation and delithiation process which leads to mechanical failure of the silicon structure within a few cycles leading to a significant and permanent loss of capacity. A number of approaches toward the development of silicon-containing anodes have been attempted. One approach was the use of a homogeneous dispersion of silicon particles within a suitable matrix to give composites that have improved mechanical stability and electrical conductivity versus pure silicon. It has been shown that silicon nanowires or fibers are able to accommodate the expansion that occurs during cycling. However, significant numbers of Si-nanowires (SiNWs) are needed for practical anode applications.

A Vapor Induced Solid-Liquid-Solid (VI-SLS) route to SiNWs has been proposed that uses bulk silicon powders thus offering the possibility of scalable and cost-effective mass manufacture without the need for a localized catalyst on a substrate. The VI-SLS process, however, is complicated by high process temperatures that tend toward the formation of carbide and oxide phases that limit electrochemical capacity and rate capabilities.

Another approach to the production of silicon nanowires is through electrospinning where the electrospun polymer fiber serves only as a template for the growth of silicon coatings by hot-wire chemical vapor deposition (CVD) or plasma enhanced CVD (PECVD). While these routes do allow the growth of a-Si nanowires with hollow cores, hot-wire and PECVD suffer from poor precursor utilization and traditionally slow growth rates.

Accordingly, there is a need for an apparatus and method for reliably producing silicon based nanowires and films that are inexpensive and amenable to continuous roll-to-roll operation. The present invention satisfies these needs as well as others and is generally an improvement over the art.

BRIEF SUMMARY OF THE INVENTION

The present invention is directed to materials and methods for producing silicon based micro and nanofibers that can be used in a variety of applications including material composites, electronic devices, sensors, photodetectors, batteries, ultracapacitors, and photosensitive substrates and the like.

Liquid silanes have been considered as precursors in direct-write fabrication of printed electronics. Cyclohexasilane ($Si_6H_{12}$), for example, can be transformed into solid polydihydrosilane $(SiH_2)_n$ by thermal treatment or light activation via radical polymerization. Additional thermolysis causes evolution of $H_2$ (g) giving a-Si:H at ~35020 C. and crystalline silicon at ~75020 C.

Marked microstructural changes, however, are associated with this thermolytic transformation. The thermal conversion of $Si_6H_{12}$-derived films and/or $(SiH_2)_n$ into a-Si occurs with marked shrinkage around 29020 C. and it appears to be related to the evolution of $SiH_2$ and $SiH_3$ fragments. This phenomenon may limit electrical transport owing to microcracking within these thin films. This shrinkage does not lead to cracking when films are less than a thickness of ~200 nm. The electrospinning methods of the present invention appear to manage the stress, in part, by reducing the dimensionality from 2D films to 1D wires.

Electrospinning, according to the invention, is a viable method for utilizing liquid cyclosilanes (i.e., $Si_nH_{2n}$) and linear or branched silanes (i.e., $Si_nH_{2n+2}$) in the fabrication of electronic materials as these monomers are transformed directly into a useful form (i.e., a nanowire) prior to the formation of the insoluble $(SiH_2)_n$ network polymer. The lateral cohesive stresses that promote cracking in the aforementioned 2D thin films are well managed in 1D wires where radial shrinkage does not lead to the observed deleterious microstructural changes of larger silicon structures.

Electrospinning is a continuous nanofabrication technique based on the principle of electrohydrodynamics, and it is capable of producing nanowires of synthetic and natural polymers, ceramics, carbon, and semiconductor materials with the diameter in the range of 1 to 2000 nm. While the Taylor cone instability associated with electrospinning was historically used for nozzle-based systems, the surface instability of thin polymer-in-solution films in the presence of an electric field enabled the development of needleless electrospinning whereby numerous jets spin coincidently allowing a continuous, roll-to-roll manufacturing process. Additionally, continuous needleless electrospinning that utilizes a rotating cone as the spinneret has been demonstrated with production throughput of up to 10 g/minute.

This is in stark contrast to the two common silicon nanowire preparation methods known in the art where the ability to scale up appears to be limited by wafer size (i.e., when forming Si nanowires via wafer etching) or a growth temperature of ~36320 C. (i.e., Au—Si eutectic in vapor-liquid-solid growth). In each instance, the transition to a continuous roll-to-roll manufacturing process is not straightforward and may not be possible.

It has been observed that the liquid silane monomers that are used in the invention are relatively unaffected by the high-voltage electrospinning process and remains associated with the polymeric carrier (i.e., poly(methyl methacrylate (PMMA) or polypropylene carbonate/polycyclohexene carbonate (QPAC100™, Empower Materials)) upon evaporation of the toluene or other solvent. Light- or heat-induced radical polymerization of the $Si_6H_{12}$ gives a viscous polydihydrosilane deposit that assumes a geometry that is related to the structure of the copolymer. The structure of the silicon nanowires prepared from $Si_6H_{12}$/polymer carrier in toluene mixtures appears to be governed by the physics of the copolymer mixtures. For example, the SEM data shows that a fibrous structure is formed after treating an electrospun composite formed from a 1.0:2.6 wt % ratio of $Si_6H_{12}$/PMMA in toluene ink. This structure appears to be related to wetting of the polymer by the liquid silane after solvent evaporation. By way of comparison, thermolysis of the composite formed by electrospinning a 1.0:2.0 wt % ratio of $Si_6H_{12}$/QPAC100 in toluene precursor gives a porous wire where it appears the liquid silane and polymer carrier exist as a microemulsion and phase separate after solvent evaporation.

It has also been observed that electrospinning three-component $Si_6H_{12}$/polymer inks gives products where the active silicon agent forms after the precursor is transformed to nano-sized material. The approach offers the ability to tailor chemical composition of Si wires by adjusting precursor chemistries to give electrospun composites that possess targeted conductivities (electrical, thermal and ionic) and maintain structural stability throughout a lifetime of charge/discharge cycles. Barring any undesirable chemical reactivity with Si—Si or Si—H bonds, particles of carbon, metals and solid electrolytes can be introduced into liquid silane-based electrospinning inks using standard dispersion chemistry. Because the spun wires convert to amorphous silicon at relatively low temperature, formation of excessive surface oxide and carbide phases can be avoided, which otherwise negatively affect capacity and rate capabilities. It is important to note that other routes to Si wires yield crystalline products that become amorphous after lithium intercalation in LIBs.

The three-component and four-component inks that are disclosed are particularly useful with electrospinning procedures and the formation of micro and nanofibers are used as an illustration. However, the inks can also be used with other deposition techniques such as thin film deposition techniques. In addition, single or coaxial nozzle formation of nanofibers is used to illustrate the methods. However, it will be understood that the inks and methods of the invention are appropriate for any electrospinning technique including use with devices that have multiple nozzles, drums or films.

By way of example, and not of limitation, a preferred method for making silicon-containing wires with a three-component ink generally comprises the steps of: (a) combining a liquid silane of the formula $Si_nH_{2n}$ or $Si_nH_{2n+2}$, a polymer and a solvent to form a viscous solution; (b) expelling the solution from a source while exposing the stream of viscous solution to a high electric field resulting in the formation of continuous fibers that are deposited onto a substrate; and (c) transforming the deposited fibers, normally with thermal processing.

In another embodiment of the invention, a preferred method for making silicon-containing wires with a four-component ink generally comprises: (a) combining a liquid silane of the formula $Si_nH_{2n}$ or $Si_nH_{2n+2}$, a polymer, a solid phase and a solvent to form a viscous solution; (b) expelling the viscous solution and exposing the viscous solution to a high electric field whereby continuous fibers form from the solution and are deposited onto a substrate; and (c) transforming the electrospun deposit.

The solid phase components are preferably particulates of many different types such as metal spheres, silicon nanowires, carbon particulates including nanotubes, as well as dopants, and metal reagents. For example, metal silicide wires can be formed with addition of metal reagents.

The polymers are preferably either a an acrylate such as poly(methyl methacrylate) or a polycarbonate. The preferred solvents are toluene, xylene, cyclooctane, 1,2,4-trichlorobenzene, dichloromethane or mixtures thereof.

The substrate is preferably a metal foil. However, the substrate may also be a carbon fiber matte, metal web or rotating mandrel.

Transformation of the deposit is preferably by thermal treatment or light activation via radical polymerization. Transformation of the deposited nanofibers can take place at any time or location and need not take place on the substrate.

In certain embodiments, the methods for producing silicon based nanofibers may further include the step of coating the fibers with an electrically conductive material. The preferred coating is a coherent, ion conductive coating of carbon such as graphite, C black, graphene, KB carbon or carbon nanotubes. The coating of the fibers is preferably applied by chemical vapor deposition or solution deposition.

The silicon-based materials and nanofibers that are produced by the three- and four-component inks can be used in a variety of applications including as an active component in other composite materials. For example, electrically-conducting silicon composite electrodes can be produced with a three-component ink according to the invention by (a) combining a liquid silane of the formula $Si_nH_{2n}$, or $Si_nH_{2n+2}$, a polymer and a solvent to form a viscous solution; (b) expelling the viscous solution into the presence of a high electric field where continuous fibers are formed and deposited onto a substrate; (c) transforming the deposit into a material that contains a polysilane, an amorphous silicon and/or a crystalline silicon fraction with or without a binder; (d) forming a coherent, conductive coating on the external porosity of the silicon-containing fraction and (e) binding the material with one or more binders. The preferred binders include poly(vinylidene fluoride-co-hexafluoropropylene) or sodium carboxymethylcellulose or an elastic carbon such as KB carbon. Some binders can be thermally decomposable.

Another example of a composite material that can be produced is an electrically-conducting photoactive silicon-composite electrode material using a four-component ink. This material can be produced by (a) combining a liquid silane of the formula $Si_nH_{2n}$ or $Si_nH_{2n+2}$, a polymer, a photoactive solid phase and a solvent to form a viscous mixture; (b) expelling the viscous mixture into the presence of a high electric field where continuous fibers of the mixture are formed and deposited onto a substrate; (c) transforming the deposit into a material that contains an amorphous silicon and/or a crystalline silicon fraction and a photoactive phase; and binding the transformed material with a binder. The preferred photoactive phase can be a carbon fullerene, a carbon nanotube, a quantum dot of CdSe, PbS, Si or Ge, a core-shell quantum dot of ZnSe/CdSe or Si/Ge.

Accordingly, an aspect of the invention is to provide three-component or four-component silane inks that can be used in the formation of silicon based films and nanofibers and composite materials.

Another aspect of the invention is to provide methods for producing polysilane nanowires and materials.

Another aspect of the invention is to provide a method for continuous production of nanofiber strands and coated nanofiber strands.

A further aspect of the invention is to provide silicon based fibers that can be used as a component in a variety of composite materials such as electrode composites.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWINGS

The invention will be more fully understood by reference to the following drawings which are for illustrative purposes only:

FIG. 1 is a flow diagram of a method of forming silicon based nanofibers from a three-component ink according to one embodiment of the invention.

FIG. 2 is a flow diagram of a method of forming silicon based nanofibers from a four-component ink according to another embodiment of the invention.

FIG. 3 is a flow diagram of a method for producing an electrode material from carbon coated silicon nanofibers formed according to one embodiment of the invention.

FIG. 6 shows Raman spectra of electrospun four-component samples after heat treatment at 55020 C. for one hour and laser crystallization for CdSe, C black, graphite, Ag, amphiphilic invertible micelle (AIP), $BBr_3$ and $PBr_3$.

DETAILED DESCRIPTION OF THE INVENTION

Figure 4:
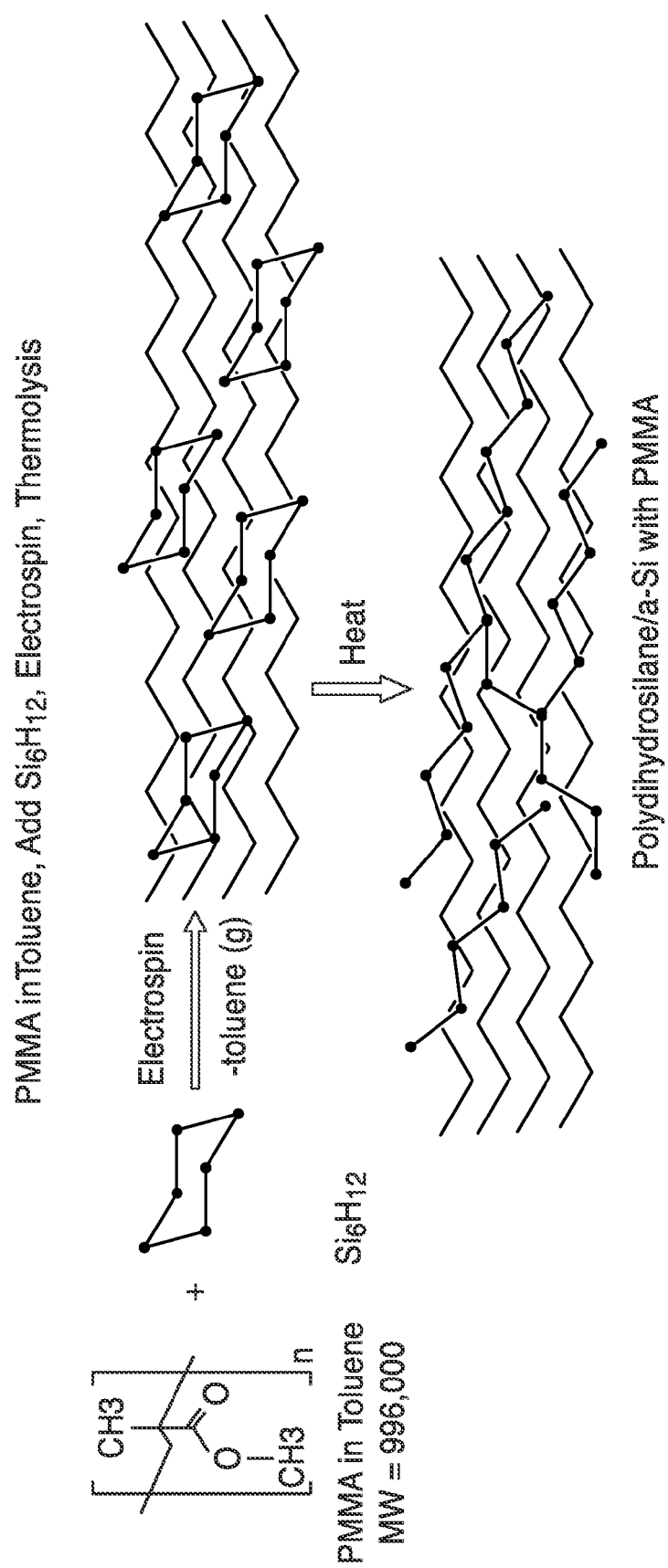
FIG. 4 is a schematic diagram of the processing of cyclohexasilane and PMMA in toluene, a three-component ink, to produce transformed nanofibers.
Figure 5:
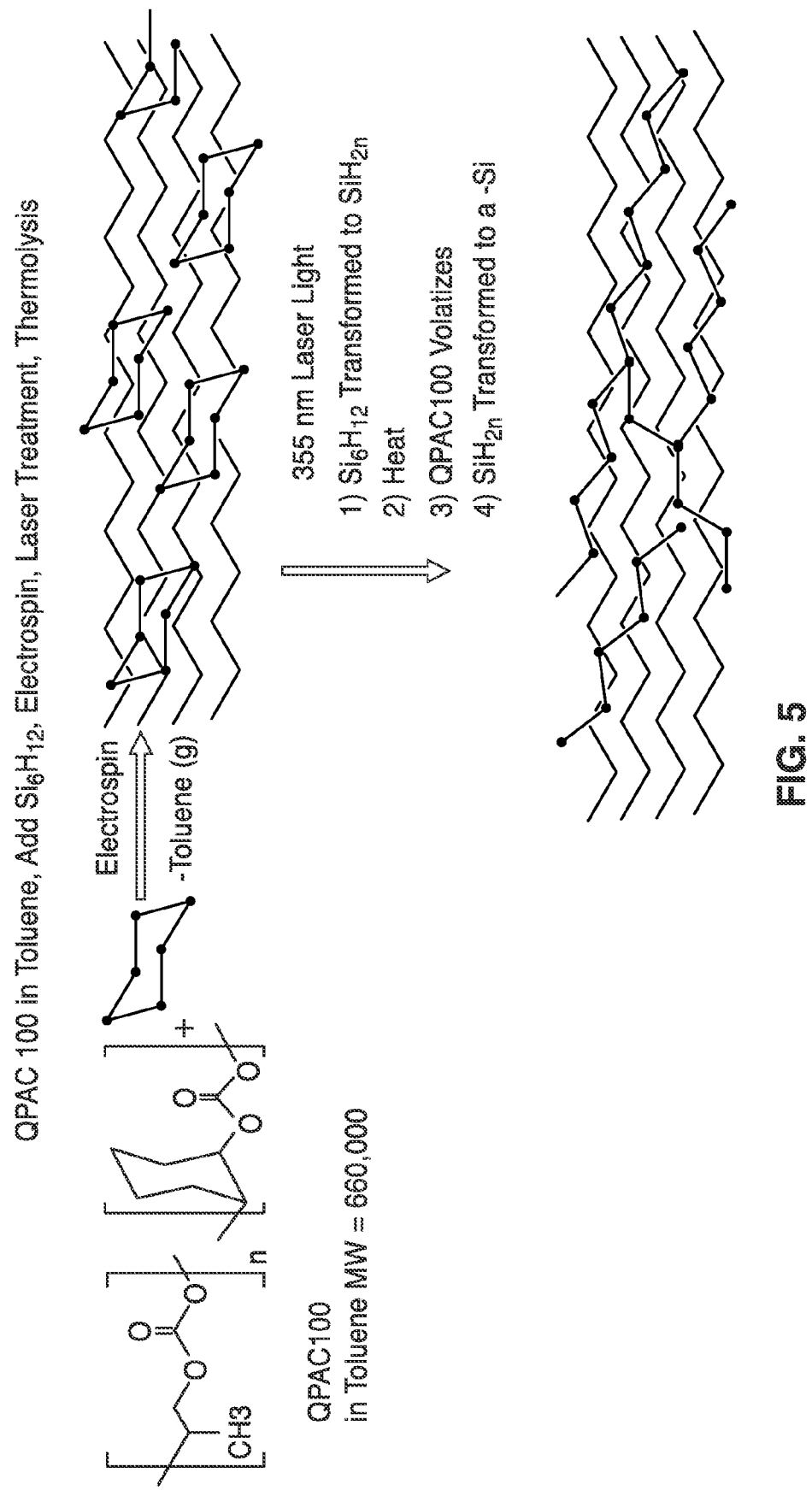
FIG. 5 is a schematic diagram of the processing of cyclohexasilane and QPAC100 in toluene, a three-component ink, to produce transformed nanofibers.

Referring more specifically to the drawings, for illustrative purposes one embodiment of the present invention is depicted in the methods generally shown in FIG. 1 through FIG. 6. It will be appreciated that the methods may vary as to the specific steps and sequence and the apparatus may vary as to structural details, without departing from the basic concepts as disclosed herein. The steps depicted and/or used in methods herein may be performed in a different order than as depicted in the figures or stated. The steps are merely exemplary of the order these steps may occur. The steps may occur in any order that is desired, such that it still performs the goals of the claimed invention.

The present invention provides methods for producing silicon containing nanowire/fiber composites and thin films that are produced from liquid silane inks by electrospinning as an illustration of an adaptation of the invention. Nanowire products from three-component and four-component liquid silane based "ink" compositions are produced and characterized to demonstrate the methods. The exemplary nanowires that are produced by the methods can be used as a component of other material compositions such as an anode for a lithium ion battery.

Turning now to FIG. 1, the steps according to a preferred embodiment 10 of the present method for producing a silicon based nanowire material using three-component liquid silane inks with an optional conductive coating is illustrated. At block 12, a solution of a liquid silane, a polymer and a solvent is provided. The resulting viscous solution preferably has a viscosity of approximately 100 cP to approximately 10,000 cP for electrospinning procedures.

The preferred liquid silane has the formula $Si_nH_{2n}$, where n=3, 4, 5, 6, 7 or 8. Linear and branched liquid silanes of the formula $Si_nH_{2n+2}$, where n=3, 4, 5, 6, 7 or 8 may also be used. Mixtures of one or more of these silanes may also be used.

Cyclohexasilane ($Si_6H_{12}$) is a particularly preferred cyclosilane. Liquid $Si_6H_{12}$ is preferably synthesized by reduction of a chlorinated salt prepared from trichlorosilane ($HSiCl_3$). Cyclohexasilane is a high melting point liquid (1820 C.) that is stable toward reduced-pressure distillation as well as ambient light. $Si_6H_{12}$ has been shown to be stable to room temperature fluorescent light for days and it can be stored for months in the solid state without marked degradation. $Si_6H_{12}$ is stable toward ultrasonic atomization and has been used as a precursor in collimated aerosol beam direct write deposition of a-Si lines. In addition, $Si_6H_{12}$ is stable when subjected to high voltage processing and electrospinning procedures to yield a-Si nanowires that may find application as anodes in lithium ion batteries and other materials.

In the embodiment shown in FIG. 1, $Si_6H_{12}$ undergoes ring opening polymerization under heat or prolonged exposure to laser light with additional thermal treatment transforming the solid polydihydrosilane $(SiH_2)_n$ into amorphous silicon first and then crystalline silicon material. Specifically, $Si_6H_{12}$ can be transformed into solid polydihydrosilane $(SiH_2)_n$ by thermal treatment or light activation via radical polymerization. Additional thermolysis causes evolution of $H_2$ (g) giving a-Si:H at ~35020 C. and crystalline silicon at ~85020 C.

In another preferred embodiment, the liquid silane is cyclopentasilane, cyclohexasilane and/or 1-silylcyclopentasilane corresponding to $Si_nH_{2n}$ where n=5 or 6.

The preferred polymer is poly(methyl methacrylate). However, a polycarbonate such as polypropylene carbonate/polycyclohexene carbonate or poly(vinylidene fluoride-co-hexafluoropropylene) and polyvinyl butyral may also be used in the embodiment shown at block 12 of FIG. 1.

In one embodiment, the percentage of silane to organic polymer in the viscous solution is kept within the range of approximately 5% to 20% silane, with the range of 10% to 16% silane preferred.

The preferred solvents at block 12 include toluene, xylene, cyclooctane, 1,2,4-trichlorobenzene, and dichloromethane or mixtures thereof. However, although these solvents are preferred, it will be understood that other solvents may be selected based on the polymers and the silanes that are employed.

At block 14, the viscous solution produced at block 12 is expelled from a nozzle or drawn from a film and exposed to a high electric field and continuous fibers arising from the solution are formed and deposited onto a substrate.

In one embodiment of the method, the high-voltage environment is formed by applying a d.c. bias from the point where the solution is expelled from a nozzle to the collecting substrate. The voltage used for the electrospinning process normally ranges from approximately 5000V to approximately 20,000V with approximately 7000V to 11,000V typically used. In a preferred embodiment, a direct current bias that is greater than approximately 2 kV is applied across a gap of 10 cm in a nitrogen environment.

The electrospinning apparatus can also have a nozzle with an inner annulus and an outer annulus. In this configuration, liquid silane is expelled through the inner annulus of a coaxial delivery tube while viscous polymer solution is expelled through the outer annulus and both fluids are exposed to a high electric field resulting in the continuous formation of fibers that are deposited onto a substrate.

In one preferred configuration, the liquid silane that is directed through the inner annulus is $Si_6H_{12}$ cyclohexasilane, $Si_6H_{12}$,1-silyl-cyclopentasilane or $Si_5H_{10}$ cyclopentasilane and the solution flowing through the outer annulus is polyacrylonitrile in dimethylformamide.

The strand of nanofiber material that is formed from solution expelled from the nozzle in a high electric field at block 30 is deposited and collected on a substrate at block 40. In the embodiment shown in FIG. 1, the substrate consists of a metallic foil such as copper foil or aluminum foil. In one configuration, the substrate includes conductive metallic portions and insulating portions and the silicon-containing wires that are produced span the insulating portions of the substrate. In another embodiment, the substrate is a conducting carbon fiber matte including a carbon fiber matte constructed of carbon nanotubes. The substrate may also be a rotating mandrel or a moving metal web of foil such as copper foil.

At block 50 the deposited and collected nanowires are transformed using thermal processing or laser processing. With cyclohexasilane based solutions, for example, the deposit can be transformed using thermal processing at temperatures ranging from approximately 150200 C. to 300200 C. to produce polysilane-containing materials. The deposit can also be transformed using thermal processing at temperatures ranging from about 300200 C. to about 850200 C., producing amorphous silicon-containing materials. The deposit from block 40 can be transformed using thermal processing at temperatures from ~850200 C. to 1414200 C. producing crystalline silicon-containing materials. As an illustration, the thermal treatment of cyclohexasilane and polymer solvent expelled through a coaxial nozzle consists of 350200 C. under $N_2$ for one hour followed by 350200 C. in air for one hour followed by 800200 C. in $N_2$ for one hour. The deposit can also be transformed using laser processing to produce crystalline silicon-containing materials.

Optionally, at block 60, the transformed fibers can be coated with a coherent, conductive coating and the coated transformed fibers can be used as a component of composite materials such as an anode material for a lithium ion battery, for example.

In one embodiment, the conductive coating is deposited by chemical vapor deposition using argon/acetylene, hydrogen/methane or nitrogen/methane as precursor gases. In another embodiment, the coherent, conductive coating is deposited by solution deposition. For example, the solution deposition may employ a dispersion of conducting carbon milled together with the silicon-containing fraction in solvent. The conductive carbon can be graphite, carbon black, graphene, or carbon nanotubes in this embodiment.

Referring now to FIG. 2, the steps according to a preferred embodiment 100 of the present method for producing a silicon-based nanowire material using four-component liquid silane inks with an optional conductive coating is illustrated. Four-component inks, according to the invention, may have essentially the same components as the three-component inks described herein with the addition of a solid phase. The solid phase may be a particulate, photoactive or a reactive compound. Processing of the four-component inks is typically the same as the processing of the three-component inks.

At block 110, a viscous solution is formed by combining a liquid silane preferably of the formula $Si_nH_{2n}$, a polymer, a solid phase and a solvent. As with the three-component inks, the components may be combined sequentially in any order or by pairs.

The preferred liquid silane has the formula $Si_nH_{2n}$, where n=3, 4, 5, 6, 7 or 8. Linear and branched liquid silanes of the formula $Si_nH_{2n+2}$, where n=3, 4, 5, 6, 7 or 8 may also be used. Mixtures of one or more of these silanes may also be used.

The preferred polymer is poly(methyl methacrylate) or a polycarbonate in the embodiment shown at block 110 of FIG. 2. The preferred solvents at block 110 of FIG. 2 include toluene, xylene, cyclooctane, 1,2,4-trichlorobenzene, and dichloromethane or mixtures thereof. However, although these polymers and solvents are preferred, it will be understood that other polymers and solvents may be selected based on the polymers, the solid phases and the silanes that are employed.

One or more solid phase components can be part of the ink mixture provided at block 110 of FIG. 2. For example, the solid phase can comprise a plurality of metallic particles, preferably nanoscale particles, which may be spherical or have a high aspect ratio. In one embodiment, the metallic particles are made of a metal such as Al, Au, Ag, Cu, In—Sn—O, fluorine-doped tin oxide, or a metal alloy. In another embodiment, the particles may be made from graphite, carbon black, or graphene. The metallic particles may also be composed of wires or tubes of suitable dimensions such as carbon nanotubes or silicon nanowires.

In other embodiments, the solid phase contains elements that are known to substitutionally-dope silicon such as boron, phosphorous, arsenic or antimony containing compounds. The solid phase component can also be semiconducting particles formed from materials such as carbon nanotubes, CdSe, CdTe, PbS, PbSe, ZnO or Si.

The solid phase component can also include polydihydrosilane —$(SiH_2)_n$—, formed by UV-irradiation of $Si_nH_{2n}$ (n=5,6) corresponding to cyclopentasilane, cyclohexasilane and/or 1-silylcyclopentasilane.

In another embodiment, metal silicide wires are formed where the solid phase at block 110 of FIG. 2 comprises a metal reagent. Examples of solid phase metal reagents includes $CaH_2$, $CaBr_2$, $Cp_2Ti(CO)_2$, $V(CO)_6$, $Cr(CO)_6$, $Cp_2Cr$, $Mn_2(CO)_{10}$, $CpMn(CO)_3$, $Fe_2(CO)_9$, $CO_2(CO)_8$, $CO_4(CO)_{12}$, $Cp_2Co$, $Cp_2Ni$, $Ni(COD)_2$, $BaH_2$, $[Ru(CO)_4]_\infty$, $Os_3(CO)_{12}$, $Ru_3(CO)_{12}$, $HFeCo_3(CO)_{12}$, $Co_2(CO)_8$ and $H_2FeRu_3(CO)_{13}$. Metal reagents at block 110 may also be a liquid such as $TiCl_4$ or $Fe(CO)_5$.

In another embodiment, the solid phase is a photoactive solid phase. For, example, the photoactive phase can be particulates of a carbon fullerene, carbon nanotubes, quantum dots of CdSe, PbS, Si or Ge, core-shell quantum dots of ZnSe/CdSe or Si/Ge.

At block 120, the solution is ejected through a nozzle in a high electric field to form a substantially continuous nanofiber through an electrospinning process. Although expulsion of a single solution though a single nozzle is described in the embodiment of FIG. 2, other solution and nozzle configurations can be used with the two and four-component inks. For example, a coaxial nozzle and dispenser system can be used that has an inner annulus and an outer annulus as illustrated in Example 16. The polymer, solid phase and a solvent can be combined to form a viscous solution that is the source of fluid flowing through the outer annulus. The selected liquid silane is a second source of fluid that is expressed through the inner annulus.

For example, the liquid silane flowing through the inner annulus is $Si_6H_{12}$ cyclohexasilane, $Si_6H_{12}$ 1-silyl-cyclopentasilane or $Si_5H_{10}$ cyclopentasilane and the solution flowing through the outer annulus is polyacrylonitrile in dimethylformamide and metal particulates or carbon nanotubes.

In another embodiment, a viscous mixture of a polymer and a solvent is produced and that mixture is ejected through the outer annulus of the nozzle while simultaneously ejecting a Liquid Silane through an inner annulus of the nozzle. The two streams are directed through a high electric field to form Core-Shell Fibers. The fibers are transformed to silicon wires with a carbon outer coating. Many other combinations are also possible with this coaxial nozzle configuration.

At block 130, the nanofiber that is formed at block 120 from the electrospinning apparatus is deposited on a conductive substrate. The substrate at block 130 is preferably a metallic foil such as copper foil or aluminum foil. The substrate can also be a conducting carbon fiber matte including a carbon fiber matte constructed of carbon nanotubes. In one configuration, the substrate includes conductive metallic portions and insulating portions and the silicon-containing wires that are produced span the insulating portions of the substrate.

The produced fiber collected at block 130 can be transformed to amorphous silicon or crystalline silicon composites through thermal treatment or light activation via radical polymerization at block 140. The deposited material can also be collected and transformed at a different time and location.

As with the three-component inks, the fibers produced from the four-component inks are typically transformed using thermal processing at temperatures from 150 to 300 20 C. to give polysilane-containing materials. The deposit can also be transformed using thermal processing at temperatures from 300 to 850 20 C. to produce amorphous silicon-containing materials. The deposit can also be transformed using thermal processing at temperatures from ~850 to 1414 20 C. giving crystalline silicon-containing materials. Some variation in these temperature ranges may be seen depending on the nature of the particular solid phase that is used in the ink. Finally, the deposit can be transformed using laser processing to give crystalline silicon-containing materials at block 140.

An optional coherent, conductive coating may be applied to the transformed materials before or after the thermal treatments at block 150. The coatings at block 150 can be applied by chemical vapor deposition using argon/acetylene, hydrogen/methane or nitrogen/methane as precursor gases. The coatings can also be applied by solution deposition using a dispersion of conducting carbon milled together with the silicon containing fraction and a solvent and graphite, C black, graphene, nanotubes or wires as a carbon source.

It can be seen that the coated or non-coated nanofibers or wires that are produced according to the invention can be used as components of other composite materials with further processing. This can be illustrated with the production of an electrically-conducting silicon-composite electrode with a three-component ink or a four-component ink. Referring also to FIG. 3, a method 200 for producing an anode material according to the invention is schematically shown. At block 210, nanofibers are produced by electrospinning two or four-component inks. The fibers are transformed at block 220 by thermal or laser processing. The processed fibers are coated with carbon at block 230. The carbon coating can be applied with chemical vapor deposition or by solution deposition. Carbon coatings preferably coatings of graphite, carbon black, graphene, or nanotubes or wires.

At block 240 the coated fibers are combined with an ion conducting binder to form the body of the electrode. The polymer binder may either be inherently lithium ion conducting, or may become lithium ion conducting by absorbing electrolyte solution. The coated nanofibers are mixed with a binder to give a material structure that can be further sized and shaped. For example, the binder may include poly(vinylidene fluoride-co-hexafluoropropylene) or sodium carboxymethylcellulose. Some binders may be volatile and capable of being removed with additional thermal or laser treatments. Other binders may also be ion or electrically conductive or have a conductive filler such as a carbon particulate like KB carbon or graphite.

Electrodes with coated silicon fibers are resistant to cracking from the sizeable volume changes that occur during the lithiation and delithiation processes during cycling, for example. KB carbon is an elastic carbon and is capable of stretching and compressing during ordinary volume changes and is a preferred conductive binder or filler at block 240.

In one embodiment, an electrode can be produced by: (a) combining a liquid silane of the formula $Si_nH_{2n}$, with a polymer such as poly(methyl methacrylate), polycarbonate, poly (vinylidene fluoride-co-hexafluoropropylene), sodium carboxymethylcellulose or a mixture of polymers and a solvent to form a viscous solution; (b) exposing the viscous solution to a high electric field where continuous fibers are formed and deposited onto a metal foil substrate; (c) transforming the deposit into a material that contains a polysilane, an amorphous silicon and/or a crystalline silicon fraction by thermal treatment under inert gas at a temperature <400 20 C.; (d) forming a coherent, ion conductive coating on the external porosity of the silicon-containing fraction deposited by vapor or solution deposition; and (e) mixing the coated silicon nanofiber material with a binder of poly(vinylidene fluoride-co-hexafluoropropylene), sodium carboxymethylcellulose and/or KB carbon to form an electrode.

The invention may be better understood with reference to the accompanying examples, which are intended for purposes of illustration only and should not be construed as in any sense limiting the scope of the present invention as defined in the claims appended hereto.

EXAMPLE 1

In order to demonstrate the functionality of the electrospinning methods with different formulations of liquid silane inks, a test reactor was constructed. All electrospinning processing and post-deposition treatments were performed inside inert nitrogen gas gloveboxes with active oxygen scrubbing unless otherwise specified. After appropriate ink formulation, three- and four-component solutions and/or mixtures were taken up into 1 mL HDPE syringes fitted with blunt-nosed 18 gauge stainless steel needles 2.5 cm in length. The ink-containing syringe and needle were placed into a syringe pump in horizontal position with a needle-to-substrate standoff distance of ~25 cm.

Metallic copper foil pieces (5 cm×5 cm×0.8 mm) were employed as the electrode substrate in the electrospinning process and were cleaned according to the following protocol: rinsing with ~5 mL isopropanol using a squirt bottle; rinsing with ~5 mL 1.5 M hydrochloric acid using a squirt bottle; rinsing with ~10 mL deionized water using a squirt bottle; and, drying with a stream of particulate-filtered high-purity nitrogen gas. These substrates were then introduced into an electrospinning process glovebox.

The substrates were then placed into deposition position by connecting the metallic foil to an acrylic backdrop using an alligator clip that also served to make electrical connection to the ground of the power supply. A high voltage source (Gamma High Voltage Research Inc. Model ES40P-12W/DDPM) was connected with the positive terminal on the needle and the negative (ground) on the metallic substrate. The syringe pump (Cole Parmer model EW-74900-00) was set to a flow rate of 0.4-0.5 mL/h and allowed to run until the needle was primed with liquid. Once a droplet formed on the outside of the needle, the power source was adjusted to 15 kV. A collimated halogen light source was used to visualize the spinning solution/mixture. Immediately after the 15 kV was applied, spinning fibers were seen moving from the needle horizontally to the substrate. The ground plate and needle location were adjusted so that the fibers were deposited at the center of the foil.

Cyclosilanes such as $Si_6H_{12}$ and $Si_5H_{10}$ were prepared and distilled under reduced vacuum yielding 99+% pure colorless liquid (by $^1H$ NMR). The $Si_5H_{10}$ was prepared by reacting $Si_5Cl_{10}$ with $LiAlH_4$ and used without additional purification. Inert atmosphere gloveboxes and standard Schlenk techniques were used to preclude the oxidation of liquid silane. This is necessary because $Si_6H_{12}$ and $Si_5H_{10}$ are pyrophoric liquids that burn upon contact with air and are treated as an ignition source and handled in inert atmosphere. In addition, $(SiH_2)_n$ reacts slowly with air and moisture to give amorphous silica.

A three-component ink, $Si_6H_{12}$/PMMA in toluene, was first used to demonstrate the electrospinning methods and the thermolysis products were characterized and shown schematically in FIG. 4. A solution of PMMA in toluene was prepared by adding 4.60 g of dry toluene to a flame-dried vial with 0.52 grams of PMMA (Aldrich P/N 182265-500G Lot# 07227DH, MW=996,000) mixed via magnetic stirring. The mixture was heated to 75° C. to expedite dissolution of the polymer. Next, 500 µL of this PMMA/toluene solution was cooled to room temperature and 100 µL of $Si_6H_{12}$ was added dropwise giving two colorless immiscible phases with one being rather viscous. After stirring for 15 minutes, the mixture appeared to be homogeneous with an apparent viscosity that was higher than either of the immiscible phases indicating the formation of a three-component microemulsion or a single-phase mixture. Electrospinning was realized as described above using a copper foil as the substrate. It is noteworthy that this process is also operative when using a lower molecular weight PMMA polymer (MW=350,000).

After electrospinning, a piece of the sample was cut off with a scissors and heat treated to ~350° C. for 30 minutes upon which time a slightly yellow tint was observed in the deposit.

The microstructure of the heat-treated deposit was then probed using a scanning electron microscope. The microstructure was shown to consist of wires with diameters from 100 nm to 3 µm. Raman microscope characterization (Horiba Jobin Yvon, LabRAM ARAMIS, 532 nm illumination) of the product confirmed the existence of amorphous silicon phase given the characteristic broad band at 485 $cm^{-1}$. Interestingly, the Raman laser can transform the a-Si wires into crystalline Si as evidenced by a band at 513 $cm^{-1}$ that was observed after the laser beam was focused to ~100 $kW/cm^2$. Optical micrographs of the electrospun deposit subjected to the higher power density show clear signs of melting and densification in the wire.

The produced electrospun nanowire materials were collected and tested for electrode performance by using the materials to make anodes in electrochemical cells. Before assembly in pouch cells, the a-Si wires were exposed to air and loaded into a chemical vapor chamber where a thin conducting carbon layer ~10 nm thick was deposited. Afterwards, the C-coated a-Si wires were moved into a second inert atmosphere argon-filled glove box ($H_2O$ and $O_2$<1 ppm). Lithium metal/a-Si wire half-cells were fabricated using Celgard-2300 as the separator and 1 M $LiPF_6$ in ethylene carbonate:diethyl carbonate 1:1 as the electrolyte with a mass loading of 4 $mg/cm^2$. Electrochemical testing was performed by cycling between 0.02 and 1.50 V at 100 mA/g using an Arbin model B2000 tester. The charge/discharge data for a half-cell comprised of lithium metal and chemical vapor deposition carbon-coated a-Si nanowires prepared according to Example 1 was recorded and demonstrated comparable characteristics over 30 cycles.

EXAMPLE 2

Electrospinning of a three-component ink, $Si_6H_{12}$/PMMA using the solvent dichloromethane (DCM), was conducted to demonstrate an alternative solvent and to characterize performance of the resulting material as an electrode. A solution of PMMA in DCM was prepared by adding 18.0 mL of dry DCM to a flame-dried vial with 2.681 g of PMMA mixed via magnetic stirring at 500 RPM for 3 h. Next, 8.220 g of this PMMA/DCM solution, 858 µL of DCM and 418 µL of $Si_6H_{12}$ were added dropwise while magnetically stirring to give a mixture of two immiscible liquids. After stirring for 15 minutes, the mixture appeared to be homogeneous with an apparent viscosity that was higher than either of the immiscible phases indicating the formation of a three-component microemulsion or a single-phase mixture. Electrospinning was realized as described above using a copper foil as the substrate.

Immediately after electrospinning each 1 mL aliquot, the deposited wires were scraped off of the copper foil and placed inside a flame-dried vial. The vials containing the samples were then heated on a ceramic hotplate with an aluminum shroud to 550° C. with a ramp rate no slower than 16° C./minute, and held for 1 h. The microstructure of the heat-treated deposit was probed using high-resolution scanning electron microscope and shown to consist of porous wires and agglomerates with primary particle size ~150 nm in diameter. Raman microscope characterization of the product confirmed the existence of amorphous silicon phase given the characteristic broad band at 485 $cm^{-1}$. The Raman laser could also transform the a-Si wires into crystalline Si as evidenced by a band at 516 $cm^{-1}$ that was observed after the laser beam was focused to ~100 $kW/cm^2$.

Optical micrographs of the electrospun deposit subjected to the higher power density showed clear signs of melting and densification in the wire. An 80 mg sample of the heated sample was sent to Galbraith Laboratories (Knoxville, Tenn.)

for ICP-OES and combustion analysis where duplicate analyses showed 83.6 wt % silicon and 6.6 wt % carbon.

The produced nanowire materials were then used to make anodes in electrochemical cells. Before assembly in pouch cells, the a-Si wires were exposed to air and loaded into a chemical vapor chamber where a thin conducting carbon layer ~10 nm thick was deposited. Afterwards, the C-coated a-Si wires were moved into a second inert atmosphere argon-filled glove box ($H_2O$ and $O_2$<1 ppm). Lithium metal/a-Si wire half-cells were fabricated using Celgard-2300 as the separator and 1 M $LiPF_6$ in ethylene carbonate:diethyl carbonate 1:1 as the electrolyte with a mass loading of 4 mg/cm². Electrochemical testing was performed by cycling between 0.02 and 1.50 V at 100 mA/g using an Arbin model B2000 tester. Charge/discharge data for a half-cell comprised of lithium metal and chemical vapor deposition carbon-coated a-Si nanowires was obtained. Specific capacity data showed an initial capacity of 3400 mAh/g, a 2nd cycle capacity of 2693 mAh/g with a fade of 16.6% after 21 cycles.

EXAMPLE 3

The product of a second three-component ink, $Si_5H_{10}$/PMMA in DCM with a post deposit treatment of 550° C. for 60 minutes and laser exposure was characterized. A 10 wt % polymer solution was prepared by adding dried and nitrogen-sparged DCM into a flame-dried glass vial with PMMA dissolved by stirring for ~12 h. At that time, 45 µL of $Si_5H_{10}$ was added to the solution using a micropipette and this mixture was stirred for 10 minutes using a PTFE-coated magnetic stir bar. The copper foil substrate was cleaned and moved into the electrospinning glovebox before being mounted and connected to the apparatus. Electrospinning was performed with a 20 cm stand-off distance, a 12 kV excitation, 0.5 mL/h ink flow rate and a total solution volume of ~75 µL was dispensed.

Post thermal treatment of the electrospun sample on copper foil was conducted in a nitrogen ambient (<1 ppm $O_2$ and $H_2O$). The sample was placed on a room temperature ceramic hotplate, and covered with an aluminum heat shield to improve temperature uniformity. The hotplate was ramped to 550° C. no slower than 30° C./minute and held at nominally 550° C. for one hour after which time, the sample was removed from the hotplate and placed on a room temperature aluminum plate and allowed to quickly cool to ambient.

Optical micrographs of the electrospun collected sample depicted wires that were ~1 µm in diameter. Raman characterization of these wires showed the existence of crystalline silicon after melting with the Raman laser.

EXAMPLE 4

The product of a three-component ink $Si_6H_{12}$/QPAC100 in toluene was characterized by two different post deposit treatments: heating at 350° C. for 20 minutes; or 355 nm laser exposure followed by heating at 350° C. for 20 minutes. The latter of these two processes is shown schematically in FIG. 5.

A polymer solution was prepared by placing 1.06 g of dried toluene into a flame-dried vial and adding 120 mg QPAC100 while stirring with a PTFE-coated magnetic stir bar for 2.5 h at 500 rpm. At this time, 50 µL $Si_6H_{12}$ was added via pipette and a slight immiscibility was noted. The mixture was stirred for ~40 h yielding a homogeneous mixture. The copper foil substrate was cleaned and moved into the electrospinning glovebox before being mounted and connected to the apparatus. Prior to electrospinning, the substrate was heat treated for one minute at 350° C. to desorb any trace water. Electrospinning was performed with a 30 cm stand-off distance, 0.5 mL/h ink flow rate and a 10 kV excitation.

After spinning for one hour, the sample was removed and cut into pieces with one being subjected to thermal treatment at 350° C. for 20 minutes. Interestingly, no wire like deposit was noted by optical microscopy after this thermal treatment. Scanning electron microscopy characterization showed dark areas that originated from the electrospun deposits with Raman characterization indicating the presence of a-Si on the substrate.

A description of this phenomenon can be envisioned by consideration of the thermal properties of each of the constituents of this three-component ink. Firstly, $Si_6H_{12}$ shows that evaporation begins at around 225° C. with some polymerization that gives 32.9% residual mass after heating to 350° C. Secondly, QPAC100 begins to thermalize around 150° C. with 50% mass loss observed at 270° C. and less than 1% residue at 350° C. Therefore, when the electrospun wire formed by the three-component $Si_6H_{12}$/QPAC100 ink was thermally-treated, the polymer component volatized prior to the formation of a structurally stable poly(dihydrosilane). As the $Si_6H_{12}$ fraction was yet unpolymerized, nano-sized Si films appeared as shadows of the original wires.

After spinning for one hour, the second sample was cut into pieces and one was placed in an air-tight container and transferred into a glovebox that contained a beam from a HIPPO laser (355 nm illumination, Spectra Physics Inc.). Variable laser powers of 500 mW, 1 W, 2 W, 3 W, and 4 W for 1 minute and also 500 mW and 4 W for 5 minutes transformed the $Si_6H_{12}$ into polysilane as evidenced by the appearance of yellow/brown discolorations for incident areas of the $Si_6H_{12}$/QPAC100 deposit. After this photolysis step, the $(SiH_2)_n$/QPAC100 sample was placed on a room temperature hotplate and heated to 341° C. for a total of 20 minutes. The a-Si wires that were formed were characterized by high-resolution scanning electron microscopy and shown to possess significant porosity. Raman characterization of the product confirmed the existence of amorphous silicon phase that was melted by focusing the Raman laser.

EXAMPLE 5

The electrospun fibers of a four-component ink PMMA/$Si_6H_{12}$/$Co_2(CO)_{10}$ in DCM and the resulting thermolysis products were characterized. A solution of PMMA in toluene was prepared by adding 10.38 mL of dry toluene to a flame-dried vial with 980 mg of PMMA mixed via magnetic stirring. 50 mg of a cobalt/silicon solution and 1 mL of the PMMA/toluene solution were mixed in a 4 mL flame-dried vial. After stirring for 15 minutes, the mixture appeared to be homogeneous. Electrospinning was realized as described above using a copper foil as the substrate.

After electrospinning, a piece of the sample was cut off with a scissors and rapidly thermal annealed to ~600° C. using an IR lamp. A piece of this sample was adhered to a glass slide with silver contacts which were deposited with a wood toothpick using fast-drying silver paint. Resistance across the two silver contacts was measured using a two-point method with the Agilent B1500A semiconductor analyzer using I-V analysis. Resistivity values were obtained by manually approximating the amount of wires which were connecting between the electrodes and approximating the length between the electrodes (2 mm) and approximating the wire diameter (3-4 µm). The resistance was measured and resistivity calculated to be $4 \times 10^4$ Ω-m.

The microstructure of the heat-treated wires was probed using a high resolution scanning electron microscope and shown to consist of wires with diameters from 1 to 3 µm. EDS mapping confirms the presence of cobalt and silicon within the wires. The non-polymer components of this four-component electrospinning ink (i.e., $Si_6H_{12}$ and $Co_2(CO)_8$) have previously been reported as reagents for forming silicon-cobalt films.

EXAMPLE 6

Another four-component ink, PMMA/$Si_6H_{12}$/CdSe in DCM and its thermolysis products were characterized. A 10 wt % solution of PMMA in dried and nitrogen-sparged DCM was mixed for ~12 h and then 0.931 g of this solution was added to a flame-dried glass vial. To that solution, 46 µL of $Si_6H_{12}$ and 47 µL of CdSe quantum dots in toluene (Lumidot® 480 nm excitation, 5 mg/mL in toluene, Sigma Aldrich P/N662356) were stirred for 10 minutes using a Teflon-coated magnetic stir bar. Electrospinning employed a copper substrate and was performed as described above.

Post-deposition treatment of electrospun deposit was performed in a nitrogen ambient (<1 ppm $O_2$ and $H_2O$). The sample was placed on a room temperature ceramic hotplate, and covered with an aluminum heat shield to improve temperature uniformity. The hotplate was ramped to 55020 C. no slower than 3020 C./minute and held at nominally 55020 C. for one hour. Thereafter, the sample was removed from the hotplate and placed on a room temperature aluminum plate and allowed to quickly cool to ambient temperature. The sample was then analyzed by Raman spectroscopy and the characteristic peak for crystalline silicon was noted after treatment with the Raman laser as shown in FIG. 6.

EXAMPLE 7

A third four-component ink, PMMA/$Si_6H_{12}$/Carbon Black in DCM, and its thermolysis products were characterized. A suspension of carbon black (Cabot Industries, Black Pearls 2000) was prepared by mixing 52 mg of the carbon black with 1 mL of dried and nitrogen-sparged DCM in a flame-dried glass vial and sonicated for 30 minutes.

In a second flame-dried glass vial was placed 0.963 g of a 10 wt solution of PMMA in dried and nitrogen-sparged DCM was mixed for ~12 h. To that solution, 48 µL of $Si_6H_{12}$ and 12 mg of the dried sonicated carbon black suspension were stirred for 10 minutes using a Teflon-coated magnetic stir bar. Electrospinning employed a copper substrate and was performed as described previously.

Post-deposition treatment of the electrospun deposit was performed in a nitrogen ambient (<1 ppm $O_2$ and $H_2O$) atmosphere. The sample was then placed on a room temperature ceramic hotplate, and covered with an aluminum heat shield to improve temperature uniformity. The hotplate was ramped to 550° C. no slower than 3020 C./minute and held at nominally 55020 C. for one hour after which time, the sample was removed from the hotplate and placed on a room temperature aluminum plate and allowed to quickly cool to ambient temperature. The sample was analyzed by Raman and the characteristic peak for crystalline silicon was noted after treatment with the Raman laser as shown in FIG. 6.

EXAMPLE 8

For comparison, a fourth four-component ink, PMMA/$Si_6H_{12}$/graphite in DCM, and its thermolysis products were characterized. A suspension of graphite (Asbury Carbon, grade 4934) was prepared by mixing 52 mg of the graphite with 1 mL of dried and nitrogen-sparged DCM in a flame-dried glass vial and sonicated for 30 minutes. A 10 wt % solution of PMMA in dried and nitrogen sparged DCM was mixed for ~12 h and 0.942 g of this solution was added to a flame-dried glass vial. To that solution, 47 µL of $Si_6H_{12}$ and 47 µL of the sonicated graphite suspension were stirred for 10 minutes using a Teflon-coated magnetic stir bar. Electrospinning employed a copper substrate and was performed as described above.

Post-deposition treatment of the electrospun deposit was performed in a nitrogen ambient (<1 ppm $O_2$ and $H_2O$). The sample was placed on a room temperature ceramic hotplate, and covered with an aluminum heat shield to reduce temperature inhomogeneity. The hotplate was ramped to 55020 C. no slower than 3020 C./minute and held at nominally 55020 C. for one hour after which time, the sample was removed from the hotplate and placed on a room temperature aluminum plate and allowed to quickly cool to ambient. The sample was analyzed by Raman and the characteristic peak for crystalline silicon was noted after treatment with the Raman laser as shown in FIG. 6.

EXAMPLE 9

The product of a fifth four-component ink, PMMA/$Si_6H_{12}$/Ag in DCM was characterized for comparison. In this illustration, a suspension of silver nanoparticles (<100 nm diameter, Sigma Alrich P/N 576832) was prepared by mixing 35 mg of the silver nanopowder with 700 µL of dried and nitrogen-sparged DCM in a flame-dried glass vial and sonicated for 30 minutes. A 10 wt % solution of PMMA in dried and nitrogen-sparged DCM was mixed for ~12 h at which time 0.923 g of this solution was added to a flame-dried glass vial. To that solution, 46 µL of $Si_6H_{12}$ and 46 µL of the sonicated silver nanoparticle suspension were stirred for 10 minutes using a Teflon coated magnetic stir bar. Electrospinning employed a copper substrate and was performed as described above.

Post-deposition treatment of the electrospun deposit was performed in a nitrogen ambient (<1 ppm $O_2$ and $H_2O$). The sample was placed on a room temperature ceramic hotplate, and covered with an aluminum heat shield to improve temperature uniformity. The hotplate was ramped to 55020 C. no slower than 3020 C./minute and held at nominally 55020 C. for one hour after which time, the sample was removed from the hotplate and placed on a room temperature aluminum plate and allowed to quickly cool to ambient. The sample was analyzed by Raman and the characteristic peak for crystalline silicon was observed after treatment with the Raman laser as shown in FIG. 6.

EXAMPLE 10

A sixth four-component ink, PMMA/$Si_6H_{12}$/AIP in DCM, was characterized to further demonstrate the breadth of the methods. A 10 wt % solution of PMMA in dried and nitrogen-sparged DCM was mixed for ~12 h after which time 0.949 g of this solution was added to a flame-dried glass vial. To that solution, 47 µL of $Si_6H_{12}$ and 47 µL of an amphiphilic invertible polymer (AIP) (synthesized from poly(ethylene glycol) (PEG) and aliphatic dicarboxylic acids) were stirred for 10 minutes using a Teflon coated magnetic stir bar. Electrospinning employed a copper substrate and was performed as described above.

Post-deposition treatment of electrospun deposit was performed in a nitrogen ambient (<1 ppm $O_2$ and $H_2O$). The sample was placed on a room temperature ceramic hotplate, and covered with an aluminum heat shield to improve temperature uniformity. The hotplate was ramped to 550 °C. no slower than 30 °C./minute and held at nominally 550 °C. for one hour after which time, the sample was removed from the hotplate and placed on a room temperature aluminum plate and allowed to quickly cool to ambient. The sample was analyzed by Raman and the characteristic peak for crystalline silicon was noted after treatment with the Raman laser as shown in FIG. 6.

EXAMPLE 11

The products of a seventh four-component ink, PMMA/$Si_6H_{12}$/$BBr_3$ in DCM were also characterized. A 10 wt % solution of PMMA in dried and nitrogen-sparged DCM was mixed for ~12 h and 0.931 g of this solution was added to a flame-dried glass vial. To that solution, 46 μL of $Si_6H_{12}$ and 1.5 μL of $BBr_3$ (>99.99% pure, Sigma Aldrich P/N 230367) were added and stirred for 10 minutes using a Teflon-coated magnetic stir bar. Electrospinning employed a copper substrate and was performed as described above.

Post-deposition treatment of the electrospun deposit was performed in a nitrogen ambient (<1 ppm $O_2$ and $H_2O$). The sample was placed on a room temperature ceramic hotplate, and covered with an aluminum heat shield to improve temperature uniformity. The hotplate was ramped to 550 °C. no slower than 30 °C./minute and held at nominally 550 °C. for one hour after which time, the sample was removed from the hotplate and placed on a room temperature aluminum plate and allowed to quickly cool to ambient. The sample was analyzed by Raman and the characteristic peak for crystalline silicon was noted after treatment with the Raman laser as shown in FIG. 6.

EXAMPLE 12

The electrospin products of an eighth four-component ink, PMMA/$Si_6H_{12}$/$PBr_3$ in DCM, were characterized for comparison. A 10 wt % solution of PMMA in dried and nitrogen-sparged DCM was mixed for ~12 h at which time 1.522 g of this solution was added to a flame-dried glass vial. To that solution, 75 μL of $Si_6H_{12}$ and 2.3 μL of $PBr_3$ (>99.99% pure, Sigma Aldrich P/N 288462) were stirred for 10 minutes using a Teflon coated magnetic stir bar. Electrospinning employed a copper substrate and was performed as described above.

Post-deposition treatment of the electrospun deposit was performed in a nitrogen ambient (<1 ppm $O_2$ and $H_2O$). The sample was placed on a room temperature ceramic hotplate, and covered with an aluminum heat shield to improve temperature uniformity. The hotplate was ramped to 550 °C. no slower than 30 °C./minute and held at nominally 550 °C. for one hour after which time, the sample was removed from the hotplate and placed on a room temperature aluminum plate and allowed to quickly cool to ambient. The sample was analyzed by Raman and the characteristic peak for crystalline silicon was noted after treatment with the Raman laser as shown in FIG. 6.

It can be seen that many different novel two or three component inks and silicon based nanowires and materials can be commercially produced in electrospinning reactors, and the feasibility of producing efficient nanowire electrodes was demonstrated.

EXAMPLE 13

The products of a ninth four-component ink, PMMA/$Si_6H_{12}$/CNTs in DCM were also characterized. A 10 wt % solution of PMMA in dried and nitrogen-sparged DCM was mixed for ~12 h at which time 1.960 g of this solution was added to a flame-dried glass vial that contained 4.04 mg of carbon nanotubes (Sigma Aldrich P/N 704148). To that solution, 98 μL of $Si_6H_{12}$ were added and stirred for 10 minutes using a Teflon coated magnetic stir bar. Electrospinning employed a copper substrate and was performed as described above.

Post-deposition treatment of the electrospun deposit was performed in a nitrogen ambient (<1 ppm $O_2$ and $H_2O$). After spinning, the sample was cut into pieces and one was placed in an air-tight container and transferred into a glovebox that contained a beam from a HIPPO laser (355 nm illumination, Spectra Physics Inc.). A laser power of 750 mW with a 1 $cm^2$ spot size was used to scan across the entire sample at a rate of 5 mm/s. After this photolysis step, the $(SiH_2)_n$/PMMA sample was placed on a room temperature hotplate and heated to 350 °C. at a ramp rate of 50 °C./10 minutes. The sample was analyzed by Raman and the characteristic peak for crystalline silicon, as well as the D and G bands of the carbon nanotubes were noted after treatment with the Raman laser.

EXAMPLE 14

The spin coating of thin films using a three-component ink, $Si_6H_{12}$/PMMA in DCM was demonstrated and compared with nanofibers produced by a conventional nozzle. A 10 wt % solution of PMMA in dried and nitrogen-sparged DCM was mixed for ~12 h at which time 0.862 g of this solution was transferred to a flame-dried glass vial. To that solution, 43 μL of $Si_6H_{12}$ was added and then stirred for 10 minutes using a Teflon-coated magnetic stir bar. The solution volume was then doubled by diluting with additional DCM.

Fused silica and quartz (1 cm×1 cm×1 mm) were employed as substrate in the spin coating process and were cleaned according to the following protocol: Liquinox™ detergent cleaning by rubbing for 30 sec with a latex glove; rinsing in a stream of hot water for 15 seconds; rinsing with ~10 mL deionized water using a squirt bottle; rinsing with ~10 mL acetone using a squirt bottle; rinsing with ~10 mL isopropanol using a squirt bottle; and, drying with the flame of a propane torch. For the spin-coating procedure, 30 μL of the $Si_6H_{12}$/PMMA sample was dispensed onto a quartz substrate while spinning at 3000 RPM and under UV irradiation from a Hg(Xe) arc lamp (Newport Corp, lamp model 66142, power density ~50 mW/$cm^2$) with a dichroic mirror used to filter the infrared photons.

Thermal treatment of samples deposited on fused silica and quartz was conducted in a nitrogen ambient (<1 ppm $O_2$ and $H_2O$). The samples were placed on a room temperature aluminum hotplate and covered with an aluminum heat shield to improve temperature uniformity. The hotplate was ramped to 350 °C. at 250 °C./h at which time the thermal treatment was quenched by removing the sample from the hotplate to an aluminum plate at ambient temperature. Raman characterization of these films showed the existence of crystalline silicon after melting with the Raman laser.

EXAMPLE 15

Spin coating of thin films using a four-component ink, $Si_6H_{12}$/PMMA/Ag in DCM was conducted to illustrate fiber formation from a thin film for comparison with other fiber producing methods. A mixture of silver nanoparticles (<100 nm diameter, Sigma Alrich P/N 576832) was prepared by mixing 35 mg of the silver nanopowder with 700 μL of dried and nitrogen-sparged DCM in a flame-dried glass vial. The vial was placed in an ultrasonic bath and treated with sonics for 30 minutes. A 10 wt % solution of PMMA in dried and nitrogen-sparged DCM was mixed for ~12 h at which time 0.923 g of this solution was transferred to a flame-dried glass vial. To this PMMA solution was added 46 µL of $Si_6H_{12}$ and 46 µL of the sonicated Ag/DCM mixture and the entire contents were stirred for 10 minutes using a Teflon-coated magnetic stir bar. The solution volume was then doubled by diluting with additional DCM.

Fused silica and quartz substrates (1 cm×1 cm×1 mm) were cleaned as described above. Thin films were prepared by spun-coating as described above using 30 µL of the four-component ink ($Si_6H_{12}$/PMMA/Ag). After spin-coating, thermal treatment of samples deposited on fused silica and quartz was conducted in a nitrogen ambient (<1 ppm $O_2$ and $H_2O$). The samples were placed on a room temperature aluminum hotplate and covered with an aluminum heat shield to improve temperature uniformity. The hotplate was ramped to 350° C. at 250° C./h at which time the thermal treatment was quenched by removing the sample from the hotplate to an aluminum plate at ambient temperature. Raman characterization of these films showed the existence of crystalline silicon after melting with the Raman laser.

EXAMPLE 16

In some instances a liquid that serves as a solvent for the polymer may react with $Si_6H_{12}$. A coaxial electrospinning approach can be employed to circumvent the deleterious interaction of $Si_6H_{12}$ with some solvents. The product formed by coaxial electrospinning where neat $Si_6H_{12}$ and a poly (acrylonitrile) (PAN) in dimethylformamide (DMF) solution were expelled from the inner and outer tubes, respectively was heat treated to 350° C. in nitrogen ambient for one hour, in air at 350° C. for one hour, and in nitrogen at 800° C. for one hour.

The PAN in DMF solution was prepared by placing 2.465 g of dried DCM into a flame-dried vial and adding a total of 548 mg PAN while stirring with a PTFE-coated magnetic stir bar for 24 h at 500 rpm. A 7.62 cm×7.62 cm×0.762 mm copper foil substrate was cleaned as previously mentioned and moved into the electrospinning glovebox before being mounted and connected to the apparatus. Electrospinning was performed with a 20 cm stand-off distance, 0.5 mL/h flow rate of both the inner and outer fluids and a 10 to 19 kV excitation.

After spinning for one hour, the sample was removed and subjected to thermal treatment at 350° C. for one hour on a hotplate in nitrogen ambient (<1 ppm $O_2$ and $H_2O$) with a ramp rate of 200° C./h, followed by tube furnace treatment in air at 350° C. for one hour and nitrogen ambient at 800° C. for one hour. Optical microscopy of the annealed coaxial electrospun sample confirms the presence of wire-like deposits with diameter ~1 µm. Raman analysis of this same sample shows the presence of silicon, as evidenced by a ~480 $cm^{-1}$ and 520 $cm^{-1}$ bands corresponding to a-Si and c-Si, respectively.

A description of this phenomenon can be envisioned by consideration of the thermal properties of each of the constituents of this three-component ink. Firstly, $Si_6H_{12}$ shows that evaporation begins at around 225° C. with some polymerization that gives 32.9% residual mass after heating to 350° C. Secondly, PAN crosslinks around 350° C. in air and thermalizes to carbon around 800° C. in nitrogen. Therefore, when the coaxial electrospun wires formed from the three-component $Si_6H_{12}$/PAN ink were thermally-treated, the silicon component converts to a-Si and/or c-Si and the polymer component carbonizes to form structurally stable and conductive carbon.

From the discussion above it will be appreciated that the invention can be embodied in various ways, including the following:

1. A method for synthesizing silicon nanofibers, comprising combining a liquid silane, a polymer and a solvent to form a viscous solution; passing a stream of viscous solution through a high electric field to form fibers; depositing the formed fibers onto a substrate; and then transforming the deposited fibers.

2. The method of embodiment 1, wherein the liquid silane is a cyclosilane of the formula $Si_nH_{2n}$ selected from the group of cyclosilanes consisting essentially of cyclopentasilane, cyclohexasilane and 1-silylcyclopentasilane.

3. The method of embodiment 1, wherein the liquid silane is a linear or branched silane of the formula $Si_nH_{2n+2}$.

4. The method of embodiment 1, wherein the polymer is selected from the group of polymers consisting essentially of poly(methyl methacrylate), a polycarbonate, poly(vinylidene fluoride-co-hexafluoropropylene), and polyvinyl butryal.

5. The method of embodiment 1, wherein the solvent is selected from the group of solvents consisting essentially of toluene, xylene, cyclooctane, 1,2,4-trichlorobenzene, dichloromethane and mixtures thereof.

6. The method of embodiment 1, wherein the substrate is selected from the group of substrates consisting essentially of a carbon fiber matte, a metal foil, and a mandrel.

7. The method of embodiment 1, wherein the deposited fibers are transformed using thermal processing at temperatures from 150° C. to 300° C. to produce polysilane-containing materials.

8. The method of embodiment 1, wherein the deposited fibers are transformed using thermal processing at temperatures from 300° C. to 850° C. to produce amorphous silicon-containing materials or wherein the transformed fiber contains polymer and amorphous silicon.

9. The method of embodiment 1, wherein the deposited fibers are transformed using thermal processing at temperatures from 850° C. to 1414° C. to produce crystalline silicon-containing materials.

10. The method of embodiment 1, wherein the deposited fibers are transformed using laser processing to give crystalline silicon-containing materials.

11. A method for synthesizing silicon nanofibers, comprising: combining a liquid silane, a polymer, a solid phase and a solvent to form a viscous solution; passing a stream of viscous solution through a high electric field to form fibers; depositing the formed fibers onto a substrate; and then transforming the deposited fibers.

12. The method of embodiment 11, wherein the liquid silane is a cyclosilane of the formula $Si_nH_{2n}$ selected from the group of cyclosilanes consisting essentially of cyclopentasilane, cyclohexasilane and 1-silylcyclopentasilane.

13. The method of embodiment 11, wherein the liquid silane is a linear or branched cyclosilane of the formula $Si_nH_{2n+2}$.

14. The method of embodiment 11, wherein the solid phase is a metallic particle selected from the group of metal particles consisting essentially of metallic particles of Al, Au, Ag, Cu, In—Sn—O, fluorine-doped tin oxide and carbon black.

15. The method of embodiment 11, wherein the solid phase is a semiconducting particle selected from the group of semiconducting particles consisting essentially of carbon nanotubes, silicon nanowires, polydihydrosilane $(Si_nH_2)_n$, CdSe, CdTe, PbS, PbSe, ZnO and Si.

16. The method of embodiment 11, wherein the solid phase is a metal reagent selected from the group of metal reagents consisting essentially of $CaH_2$, $CaBr_2$, $Cp_2Ti(CO)_2$, $TiCl_4$, $V(CO)_6$, $Cr(CO)_6$, $Cp_2Cr$, $Mn_2(CO)_{10}$, $CpMn(CO)_3$, $Fe(CO)_5$, $Fe_2(CO)_9$, $Co_2(CO)_8$, $CO_4(CO)_{12}$, $Cp_2Co$, $Cp_2Ni$, $Ni(COD)_2$, $BaH_2$, $[Ru(CO)_4]_\infty$, $Os_3(CO)_{12}$, $Ru_3(CO)_{12}$, $HFeCo_3(CO)_{12}$, and $H_2FeRu_3(CO)_{13}$.

17. The method of embodiment 11, wherein the solid phase is a photoactive particle selected from the group of photoactive particles consisting essentially of a carbon fullerene, a quantum dot of CdSe, PbS, Si or Ge, and a core-shell quantum dot of ZnSe/CdSe or Si/Ge.

18. The method of embodiment 11, further comprising coating the transformed fibers with a coherent, conductive coating.

19. The method of embodiment 11, wherein the coating is a coating selected from the group of coatings consisting essentially of graphite, carbon black, KB Carbon, carbon nanotubes and graphene.

20. A method of making silicon-containing composite wires comprising: combining a polymer and a solvent to form a viscous solution; flowing liquid silane through the inner annulus of a coaxial delivery tube while flowing the viscous polymer mixture through the outer annulus; exposing the viscous solution to a high electric field where continuous fibers are formed and deposited onto a substrate; and transforming the deposited fibers into a composite material that contains on the inside a polysilane, an amorphous silicon and/or a crystalline silicon fraction and on the outside a carbon coating.

21. The method of embodiment 20, wherein the liquid silane flowing through the inner annulus is selected from the group of cyclosilanes consisting essentially of $Si_6H_{12}$ cyclohexasilane, $Si_6H_{12}$ 1-silyl-cyclopentasilane and $Si_5H_{10}$ cyclopentasilane.

22. The method of embodiment 20, wherein the liquid silane flowing through the inner annulus is selected from the group of linear and branched silanes consisting essentially of $Si_nH_{2n+2}$.

23. The method of embodiment 20, wherein the solution flowing through the outer annulus is polyacrylonitrile in dimethylformamide.

24. A method for making silicon-containing battery electrode composite, comprising: combining a liquid silane of the formula $Si_nH_{2n}$, with a polymer and a solvent to form a viscous solution; expelling the viscous solution through a high electric field wherein continuous fibers are formed and deposited onto a metal foil substrate; transforming the deposited fibers by thermal treatment under inert gas; forming a coherent, ion conductive coating on the transformed fibers; and mixing the coated silicon nanofibers with a binder and KB carbon to form an electrode.

25. An electrospinning ink, comprising a liquid silane of the formula $Si_nH_{2n}$; a polymer; and a solvent.

26. An electrospinning ink, comprising a liquid silane of the formula $Si_nH_{2n}$; a polymer; a solid phase; and a solvent.

27. The electrospinning ink of embodiment 26, wherein the solid phase is a metallic particle selected from the group of metal particles consisting essentially of spherical metallic particles of Al, Au, Ag, Cu, In—Sn—O, fluorine-doped tin oxide and carbon black.

28. The electrospinning ink of embodiment 26, wherein the solid phase is a semiconducting particle selected from the group of semiconducting particles consisting essentially of carbon nanotubes, silicon nanowires, polydihydrosilane $(Si_nH_2)_n$, CdSe, CdTe, PbS, PbSe, ZnO and Si.

29. The electrospinning ink of embodiment 26, wherein the solid phase is a metal reagent selected from the group of metal reagents consisting essentially of $CaH_2$, $CaBr_2$, $Cp_2Ti(CO)_2$, $TiCl_4$, $V(CO)_6$, $Cr(CO)_6$, $Cp_2Cr$, $Mn_2(CO)_{10}$, $CpMn(CO)_3$, $Fe(CO)_5$, $Fe_2(CO)_9$, $Co_2(CO)_8$, $CO_4(CO)_{12}$, $Cp_2Co$, $Cp_2Ni$, $Ni(COD)_2$, $BaH_2$, $[Ru(CO)_4]_\infty$, $Os_3(CO)_{12}$, $Ru_3(CO)_{12}$, $HFeCo_3(CO)_{12}$, and $H_2FeRu_3(CO)_{13}$.

30. The electrospinning ink of embodiment 26, wherein the solid phase is a photoactive particle selected from the group of photoactive particles consisting essentially of a carbon fullerene, a quantum dot of CdSe, PbS, Si or Ge, and a core-shell quantum dot of ZnSe/CdSe or Si/Ge.

31. The electrospinning ink of embodiment 26, wherein the cyclosilane is a branched cyclosilane of the formula $Si_nH_{2n+2}$.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for synthesizing silicon nanofibers, comprising:
    combining a liquid silane, a polymer and a solvent to form a viscous solution;
    passing a stream of viscous solution through a high electric field to form fibers;
    depositing the formed fibers onto a substrate; and
    transforming the deposited fibers.

2. A method as recited in claim 1, wherein said liquid silane is a cyclosilane of the formula $Si_nH_{2n}$ selected from the group of cyclosilanes consisting of cyclopentasilane, cyclohexasilane and 1-silylcyclopentasilane.

3. A method as recited in claim 1, wherein said liquid silane is a linear or branched cyclosilane of the formula $Si_nH_{2n+2}$.

4. A method as recited in claim 1, wherein said polymer is selected from the group of polymers consisting of poly(methyl methacrylate), polycarbonate, poly(vinylidene fluoride-co-hexafluoropropylene), and polyvinyl butryal.

5. A method as recited in claim 1, wherein said solvent is selected from the group of solvents consisting of toluene, xylene, cyclooctane, 1,2,4-trichlorobenzene, dichloromethane or mixtures thereof.

6. A method as recited in claim 1, wherein said substrate is selected from the group of substrates consisting of a carbon fiber matte, a metal foil, and a mandrel.

7. A method as recited in claim 1, wherein the deposited fibers are transformed using thermal processing at temperatures from 150° C. to 300° C. to produce polysilane-containing materials.

8. The method recited in claim 1, wherein the deposited fibers are transformed using thermal processing at temperatures from 300° C. to 850° C. to produce amorphous silicon-containing materials.

9. The method as recited in claim 1, wherein the deposited fibers are transformed using thermal processing at temperatures from 850° C. to 1414° C. to produce crystalline silicon-containing materials.

10. The method as recited in claim 1, wherein the deposited fibers are transformed using laser processing to give crystalline silicon-containing materials.

11. A method for synthesizing silicon nanofibers, comprising:
combining a liquid silane, a polymer, a solid phase and a solvent to form a viscous solution;
passing a stream of viscous solution through a high electric field to form fibers;
depositing the formed fibers onto a substrate; and
transforming the deposited fibers.

12. A method as recited in claim 11, wherein said liquid silane is a cyclosilane of the formula $Si_nH_{2n}$ selected from the group of cyclosilanes consisting of cyclopentasilane, cyclohexasilane and 1-silylcyclopentasilane.

13. A method as recited in claim 11, wherein said liquid silane is a linear or branched cyclosilane of the formula $Si_nH_{2n+2}$.

14. A method as recited in claim 11, wherein said solid phase is a metallic particle selected from the group of metal particles consisting of metallic particles of Al, Au, Ag, Cu, In—Sn—O, fluorine-doped tin oxide and carbon black.

15. A method as recited in claim 11, wherein said solid phase is a semiconducting particle selected from the group of semiconducting particles consisting of carbon nanotubes, silicon nanowires, polydihydrosilane $(Si_nH_2)_n$, CdSe, CdTe, PbS, PbSe, ZnO and Si.

16. A method as recited in claim 11, wherein said solid phase is a metal reagent selected from the group of metal reagents consisting of $CaH_2$, $CaBr_2$, $Cp_2Ti(CO)_2$, $TiCl_4$, $V(CO)_6$, $Cr(CO)_6$, $Cp_2Cr$, $Mn_2(CO)_{10}$, $CpMn(CO)_3$, $Fe(CO)_5$, $Fe_2(CO)_9$, $Co_2(CO)_8$, $CO_4(CO)_{12}$, $Cp_2Co$, $Cp_2Ni$, $Ni(COD)_2$, $BaH_2$, $[Ru(CO)_4]_\infty$, $Os_3(CO)_{12}$, $Ru_3(CO)_{12}$, $HFeCo_3(CO)_{12}$, and $H_2FeRu_3(CO)_{13}$.

17. A method as recited in claim 11, wherein said solid phase is a photoactive particle selected from the group of photoactive particles consisting of a carbon fullerene, a quantum dot of CdSe, PbS, Si or Ge, and a core-shell quantum dot of ZnSe/CdSe or Si/Ge.

18. A method as recited in claim 11, further comprising:
coating the transformed fibers with a coherent, conductive coating.

19. A method as recited in claim 11, wherein the coating is a coating selected from the group of coatings consisting of graphite, carbon black, KB Carbon, carbon nanotubes and graphene.

20. A method of making silicon-containing composite wires comprising:
combining a polymer and a solvent to form a viscous solution;
flowing liquid silane through the inner annulus of a coaxial delivery tube while flowing the viscous polymer solution through the outer annulus;
exposing the viscous mixture to a high electric field where continuous fibers are formed and deposited onto a substrate; and
transforming the deposited fibers into a composite material that contains on the inside a polysilane, an amorphous silicon and/or a crystalline silicon fraction and on the outside a carbon coating.

21. A method as recited in claim 20, wherein the liquid silane flowing through the inner annulus is selected from the group of cyclosilanes consisting of $Si_6H_{12}$ cyclohexasilane, $Si_6H_{12}$ 1-silyl-cyclopentasilane and $Si_5H_{10}$ cyclopentasilane.

22. A method as recited in claim 20, wherein the liquid silane flowing through the inner annulus is selected from the group of linear and branched silanes having the formula $Si_nH_{2n+2}$.

23. A method as recited in claim 20, wherein the solution flowing through the outer annulus is polyacrylonitrile in dimethylformamide.

24. A method for making silicon-containing battery electrode composite, comprising:
combining a liquid silane of the formula $Si_nH_{2n}$, with a polymer and a solvent to form a viscous solution;
expelling the viscous solution through a high electric field wherein continuous fibers are formed and deposited onto a metal foil substrate;
transforming the deposited fibers by thermal treatment under inert gas;
forming a coherent, ion conductive coating on the transformed fibers; and mixing
the coated silicon nanofibers with a binder and KB carbon to form an electrode.

* * * * *